US009823687B2

(12) United States Patent
Mukherji et al.

(10) Patent No.: US 9,823,687 B2
(45) Date of Patent: Nov. 21, 2017

(54) LOW FREQUENCY PRECISION OSCILLATOR

(71) Applicant: SILICON LABORATORIES INC., Austin, TX (US)

(72) Inventors: Arup Mukherji, Austin, TX (US); John M. Khoury, Austin, TX (US)

(73) Assignee: SILICON LABORATORIES INC., Austin, TX (US)

(*) Notice: Subject to any disclaimer, the term of this patent is extended or adjusted under 35 U.S.C. 154(b) by 0 days.

(21) Appl. No.: 14/978,837

(22) Filed: Dec. 22, 2015

(65) Prior Publication Data

US 2017/0177020 A1   Jun. 22, 2017

(51) Int. Cl.
| H03L 7/00 | (2006.01) |
| G06F 1/04 | (2006.01) |
| H03B 5/24 | (2006.01) |
| H03B 5/36 | (2006.01) |
| H03M 3/00 | (2006.01) |
| H03B 1/00 | (2006.01) |

(52) U.S. Cl.
CPC ............... *G06F 1/04* (2013.01); *H03B 1/00* (2013.01); *H03B 5/24* (2013.01); *H03B 5/36* (2013.01); *H03M 3/30* (2013.01)

(58) Field of Classification Search
CPC . H03B 27/00; H03B 5/24; H03B 5/36; H03B 1/00; G06F 1/04; H03M 3/30
USPC .......................... 331/46, 55, 47, 2, 158, 176
See application file for complete search history.

(56) References Cited

U.S. PATENT DOCUMENTS

| 7,421,251 B2* | 9/2008 | Westwick ................. H03L 7/00 455/141 |
| 2007/0176705 A1* | 8/2007 | Sutardja .................. H01L 23/34 331/176 |

OTHER PUBLICATIONS

Danielle Griffith, James Murdock, Per Torstein Røine, Thomas Murphy; ISSCC 2015/ Session 5 / Analog Techniques 15.9; A 37μW Dual-Mode Crystal Oscillator for Single-Crystal Radios; 2015 IEEE International Solid-State Circuits Conference.
Danielle Griffith, Per Torstein Roine, James Murdock, Ryan Smith; ISSCC 20141 Session 17/ Analog Techniques / 17.8; A 190nW 33kHz RC Oscillator with ±0.21% Temperature Stability and 4ppm Long-Term Stability; 2014 IEEE International Solid-State Circuits Conference.
Arun Paidimarri, Danielle Griffith, Alice Wang, Anantha P. Chandrakasan, Gangadhar Burra; ISSCC 2013 / Session 10 / Analog Techniques / 10.7; A 120nW 18.5kHz RC Oscillator with Comparator Offset Cancellation for ±0.25% Temperature Stability; 2013 IEEE International Solid-State Circuits Conference.
Keng-Jan Hsiao; A 32A ppm/° C. 3.2-1.6V Self-chopped Relaxation Oscillator with Adaptive Supply Generation; 2012 Symposium on VLSI Circuits Digest of Technical Papers.

* cited by examiner

Primary Examiner — Arnold Kinkead
(74) Attorney, Agent, or Firm — Trop, Pruner & Hu, P.C.

(57) ABSTRACT

A technique includes using a first oscillator to clock operations of a radio of an integrated circuit (IC). The technique includes intermittently using the first oscillator to frequency tune a second oscillator of the IC.

10 Claims, 12 Drawing Sheets

_US 9,823,687 B2_

LOW FREQUENCY PRECISION OSCILLATOR

BACKGROUND

Clock signals may be used in an electronic system for such purposes as synchronizing operations of a processor core or radio; keeping track of time; initiating periodic activity; and so forth. A typical electronic system includes one or multiple oscillators to generate periodic signals from which the system's clock signals are derived. One type of oscillator is a relaxation oscillator, such as a resistor-capacitor (RC)-based oscillator, which has a relaxation frequency that is a function of one or multiple capacitances and one or multiple resistances of the oscillator. Another type of oscillator is a crystal-based oscillator, which has a resonant frequency that is set by the mechanical resonance of a vibrating piezoelectric crystal.

SUMMARY

In an example embodiment, a technique includes using a first oscillator to clock operations of a radio of an integrated circuit (IC). The technique includes intermittently using the first oscillator to frequency tune a second oscillator of the IC.

In accordance with another example embodiment, an apparatus includes a first oscillator, a second oscillator and a tuning circuit. The first oscillator provides a first clock signal, and the second oscillator provides a second clock signal. The tuning circuit responds to a trigger event to tune the second oscillator based at least in part on a frequency of the first clock signal.

In accordance with yet another example embodiment, an apparatus includes an integrated circuit (IC), which includes a radio, a crystal-based oscillator to provide a clock signal for the radio, a resistor-capacitor (RC)-based oscillator, and a tuning circuit. The tuning circuit responds to trigger events to intermittently tune the RC-based oscillator based at least in part on a frequency of the clock signal that is provided by the crystal-based oscillator.

Advantages and other features will become apparent from the following drawings, description and claims.

DETAILED DESCRIPTION

Figure 1:
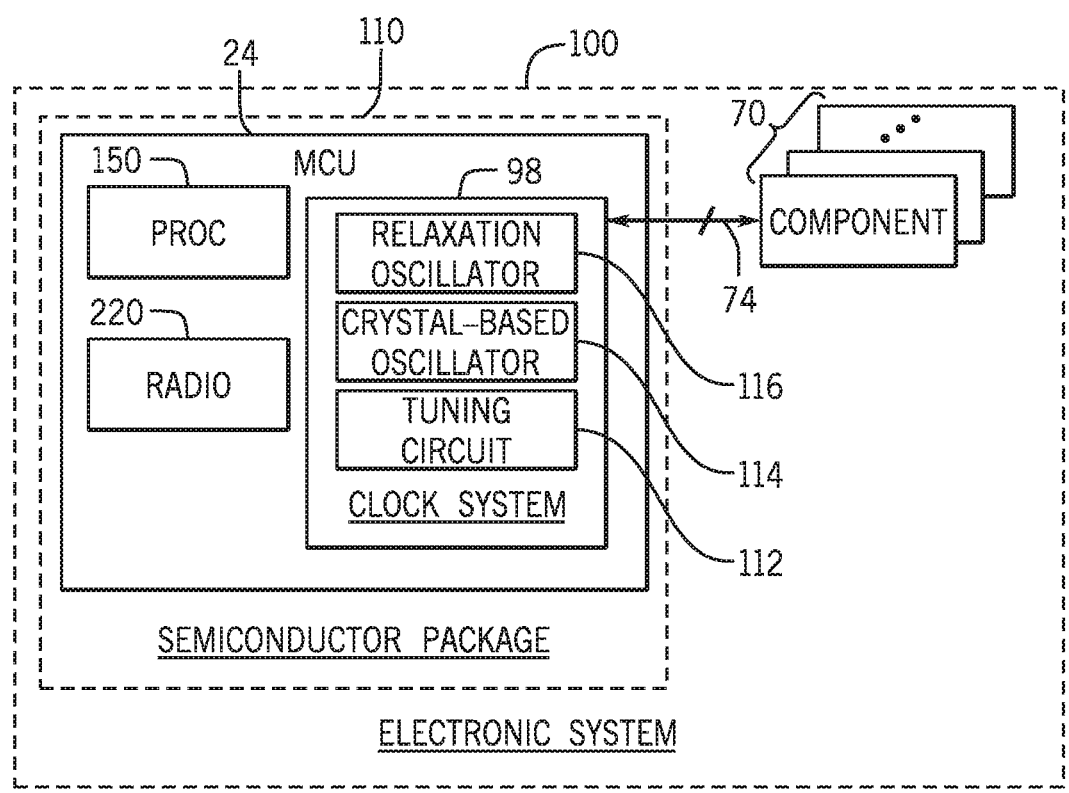
FIG. 1 is a schematic diagram of an electronic system according to an example embodiment.

An electronic system, such as a microcontroller unit (MCU)-based platform, may use a clock signal that has a relatively high frequency (a frequency above 1 MegaHertz (MHz), for example) and a relatively high precision (a precision within ±40 parts per million (ppm), for example) to synchronize operations of certain components of the system. For example, the electronic system may clock a short range wireless radio with a 38.4 MHz clock signal that has a precision of ±40 ppm. The electronic system may also use one or multiple relatively low frequency clock signals to synchronize operations of other components of the system. For example, the electronic system may include a relatively low frequency, kiloHertz (kHz) frequency range clock signal for such purposes as generating a real time clock (RTC); providing a periodic wakeup for a processor core to perform calibrations and other operations; triggering components of the system to check sensor inputs; clocking event timers; and so forth. One or more of these lower frequency components, such as a precision event timer, may be used to precisely time operations of the electronic system, and as such, the electronic system use relatively precise low frequency clock signals to clock operations of these components.

Because a crystal-based oscillator generates a relatively precise signal, the electronic system may have a dedicated crystal-based oscillator to generate a precise low frequency clock signal. As such, in one approach, the electronic system may have two crystal-based oscillators: a high frequency crystal based-oscillator (i.e., a precise high frequency oscillator) and a low frequency crystal-based oscillator (i.e., a precise low frequency oscillator). Alternatively, the electronic system may contain a single high frequency crystal-based oscillator and circuitry to frequency divide the oscillator's clock signal to generate a precise low frequency clock signal.

In accordance with example embodiments that are disclosed herein, an electronic system intermittingly tunes an otherwise relatively imprecise low frequency oscillator using the output of a relatively precise high frequency oscillator. More specifically, in accordance with example embodiments, an MCU-based platform (an electronic system) includes a relaxation oscillator, such as a resistor-capacitor (RC)-based oscillator, to provide a relatively low frequency clock signal that may be used to clock low frequency digital components of the platform, which are associated with precisely-timed operations, such as precision event timers. Although an relaxation oscillator typically is not associated with high precision, as described herein, the MCU-based platform also contains a crystal-based oscillator that is used to intermittingly tune the relaxation oscillator. In this manner, the MCU-based platform uses the relatively precise clock signal that is provided by the crystal-based oscillator to intermittently tune the relaxation oscillator to control variations of the relaxation oscillator due to temperature so that the relaxation oscillator effectively provides a precise low frequency clock signal. Therefore, in accordance with example embodiments, the MCU-based platform does not contain a crystal-based oscillator to generate precise low frequency clock signals, thereby eliminating the expenses and resources associated with such an approach, such as extra package pins and capacitors for the associated crystal; additional circuit board space for the crystal; and so forth. Moreover, in accordance with example embodiments, the MCU-based platform does not frequency divide a relatively higher clock frequency to generate the precise low frequency clock signal, thereby avoiding a relatively high power consumption (due to the high frequency oscillator continuously operating, for example), which may be particular advantageous for battery-operated applications.

Referring to FIG. 1, as a more specific example embodiment, an electronic system 100 includes a clock system 98 that contains multiple clock sources, including an a relaxation oscillator 116 to provide a relatively precise and relatively low frequency clock signal (a 32.768 kHz clock signal, for example) for precisely-timed digital components, such as precision event timers of the electronic system 100; and a crystal-based oscillator 114 to provide a relatively precise and relatively high frequency clock signal (a 38.4 MHz clock for signal, for example) for one or more precisely-timed high frequency components of the electronic system 100, such as a short-range wireless radio 220.

As described herein, the MCU 24 contains a tuning circuit 112 that intermittingly tunes the relaxation oscillator 116 using the crystal-based oscillator 114 as a reference so that the relaxation oscillator 116 maintains a relatively precise output clock signal frequency. In this context, "intermittingly" tuning the relaxation oscillator 116 refers to tuning the oscillator 116 at times, includes initiating the tuning of the oscillator 116 at times that correspond pursuant to a periodic schedule, as well as tuning the oscillator 116 at times that are not regular or correspond to a periodic schedule. As described herein, in accordance with example embodiments, the tuning of the relaxation oscillator 116 may occur in response to trigger events, with the overall goal being to maintain a variation of the oscillator's frequency (due to temperature or other factor) within a certain degree of precision.

The electronic system 100, in accordance with example embodiments, includes a microcontroller unit (MCU) 24, which controls various aspects of one or more components 70 of the electronic system 100. In general, the MCU 24 communicates with the components 70 via communication input/output (I/O) signals 74, which may be wireless signals; hardwired cables-based signals; and so forth, depending on the particular embodiment. As examples, the components 70 may include such components as a lighting element; an electrical motor; a household appliance; an inventory control terminal; a computer; a tablet; a smart power meter; a wireless interface; a cellular interface; a radio frequency (RF) front end interface; an interactive touch screen user interface; and so forth.

As depicted in FIG. 1, in accordance with example embodiments, all or part of the components of the MCU 24 may be part of a semiconductor package 110. In this manner, all or part of the components of the MCU 24 may be fabricated on a single die or on multiple dies, depending on the particular embodiment, and encapsulated to form the semiconductor package 110.

Figure 2:
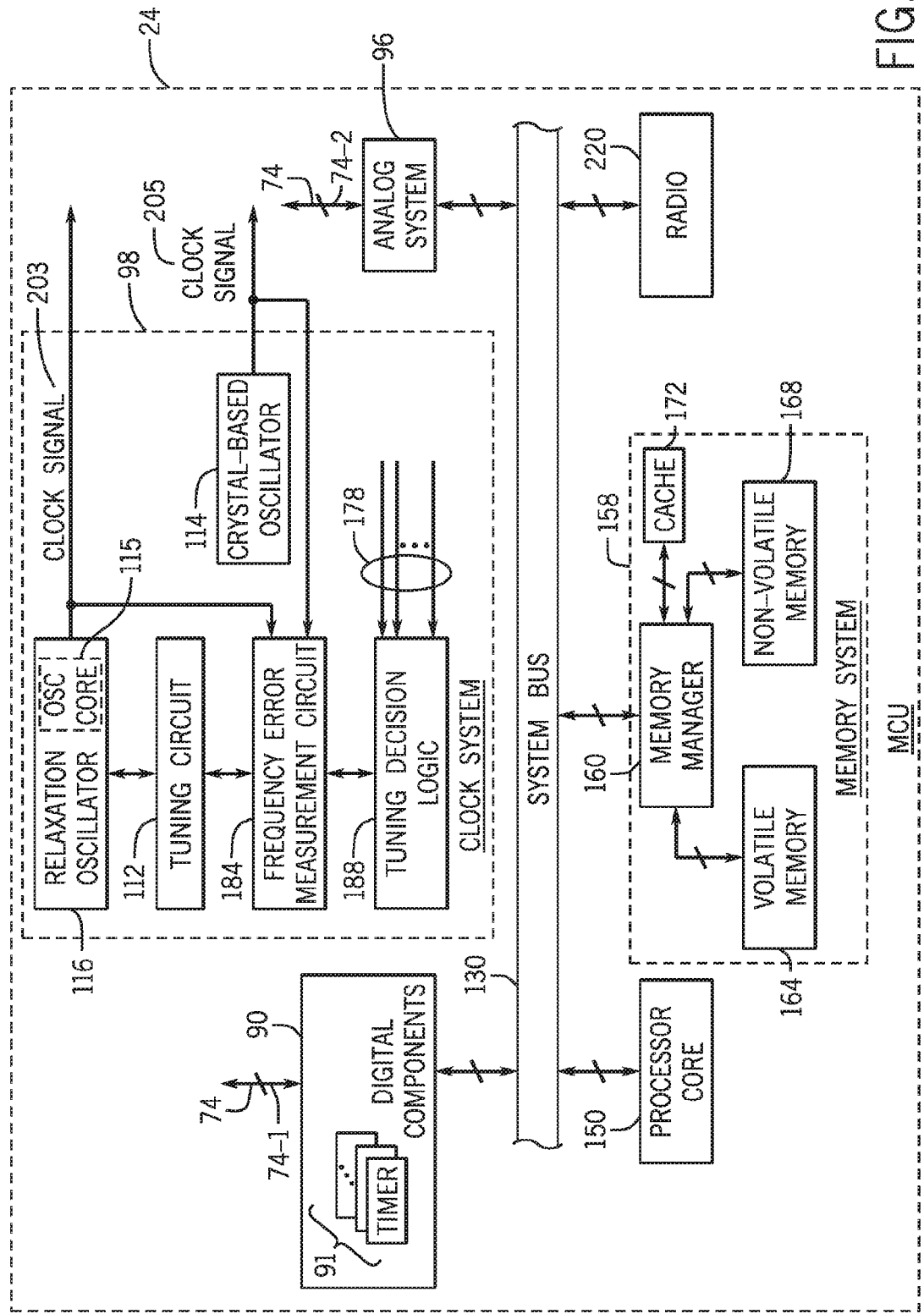
FIG. 2 is a schematic diagram of a microcontroller unit (MCU) of the electronic system in FIG. 1 according to an example embodiment.

Referring to FIG. 2 in conjunction with FIG. 1, in accordance with example embodiments, the MCU 24 contains one or multiple processor cores 150, digital components 90 and an analog system 96. As an example, the processor core 150 may be a 32-bit core, such as an Advanced RISC Machine (ARM) processor core, which executes a Reduced Instruction Set Computer (RISC) instruction set. In further example embodiments, the processor core 150 may be a less powerful core, such as an 8-bit core (an 8051 core, for example). The digital components 90 may be, as examples, one or multiple time precision event timers 91, a Universal Serial Bus (USB) interface; a universal asynchronous receiver/transmitter (UART) interface; a system management bus interface (SMB) interface; a serial peripheral interface (SPI) interface; and so forth. In general, the digital components 90 may communicate with devices that are external to the MCU 24 via associated I/O signals 74-1.

The analog system 96 may include various analog components and systems that receive analog signals, such as analog-to-digital converters (ADCs) and comparators; as well as analog components that provide analog signals, such as current drivers. In general, the analog system 96 communicates with devices that are external to the MCU 24 via associated I/O signals 74-2.

Among its other components, the MCU 24 may include a system bus 130 that is coupled to the digital components 90, analog system 96 and processor core 150. A memory system 158 is also coupled to the system bus 130. The memory system includes a memory controller, or manager 160, which controls access to various memory components of the MCU 24, such as a cache 172, a non-volatile memory 168 (a Flash memory, for example) and a volatile memory 164 (a static random access memory (SRAM), for example). In accordance with example embodiments, the volatile memory 164 and the non-volatile memory 168 may form the system memory of the MCU 24. In other words, the volatile memory 164 and the non-volatile memory 168 have memory locations that are part of the system memory address space for the MCU 24.

It is noted that FIG. 2 depicts a general simplified representation of an example MCU architecture, as the MCU 24 have many other components, bridges, buses, and so forth, in accordance with further embodiments, which are not depicted in FIG. 2. For example, in accordance with further example embodiments, the MCU 24 may have a bus matrix module that responds to slave side arbitration to regulate access to the memory devices of the MCU 24. Thus, many other embodiments are contemplated, which are within the scope of the appended claims.

In accordance with example embodiments, the clock system 98 includes the tuning circuit 112 that intermittently calibrates, or tunes, the fundamental (or relaxation) clock frequency of the relaxation oscillator 116 to maintain a relatively precise clock signal 203 for the oscillator 116. As described herein, depending on the particular embodiment, the tuning circuit 112 may tune the relaxation oscillator 116 in its oscillator core 115 or may tune the oscillator 116 by conditioning a signal that is produced by the oscillator core 115.

In general, the tuning circuit 112 may be controlled by a signal that is provided by a frequency error measurement circuit 184. In this regard, in accordance with example embodiments, the frequency error measurement circuit 184 is enabled by tuning decision logic 188 in response to the occurrence of periodic or aperiodic events in the MCU 24 and/or a predetermined environmental change (a temperature change, for example) of the relaxation oscillator 116. As depicted in FIG. 2, in accordance with some embodiments, the tuning decision logic 188 may receive various event trigger signals 178, which are processed by the tuning decision logic 188 for purposes of determining when to enable the frequency error measurement circuit 184, as further described herein.

In accordance with example embodiments, when enabled, the frequency error measurement circuit 184 performs a comparison of the frequency of the clock signal 203 that is provided by the relaxation oscillator 116 with a clock signal 205 that is provided by the crystal-based oscillator 114. As a result of this measurement, the frequency error measurement circuit 184 provides a signal to the tuning circuit 112 for purposes of recalibrating, or retuning, the relaxation oscillator 116, as further described herein.

Figure 3:
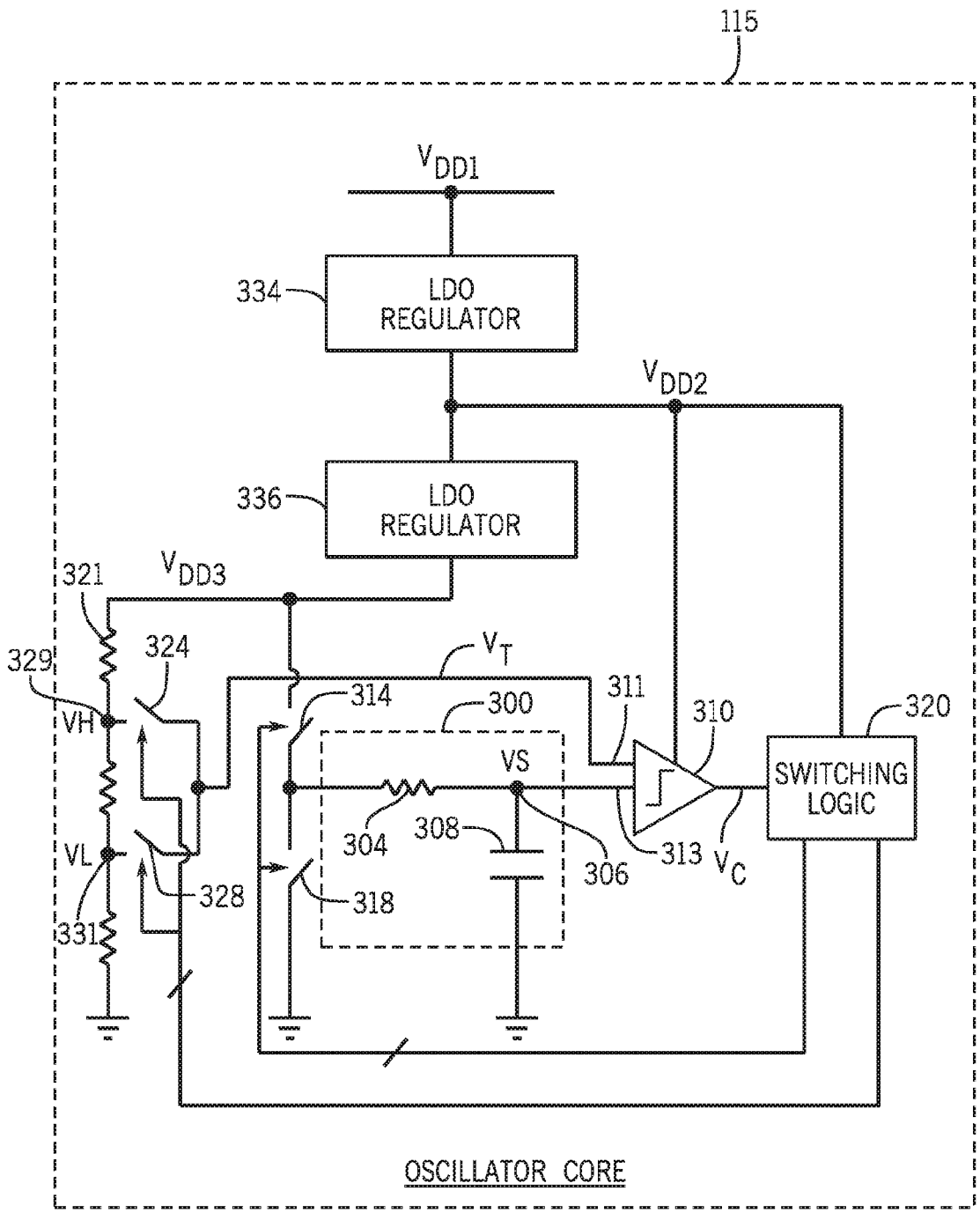
FIG. 3 is a schematic diagram of an oscillator core of a resistor-capacitor (RC)-based oscillator of FIG. 2 according to an example embodiment.

Referring to FIG. 3, in accordance with example embodiments, the relaxation oscillator 116 may be a resistor capacitor (RC)-based oscillator that contains a relaxation circuit 300, which includes a resistor 304 and a capacitor 308. For the embodiment of FIG. 3, the relaxation frequency of the oscillator core 115 is inversely proportional to the product of the resistance of the resistor 304 and the capacitance of the capacitor 308. It is noted that in accordance with further embodiments, the relaxation circuit 300 may contain other and potentially more complex RC networks, such as networks that contain multiple capacitors and multiple resistors. Moreover, in accordance with further example embodiments, the relaxation oscillator may be an oscillator other than an RC-based oscillator.

In operation, the capacitor 308 is charged and discharged once every oscillation cycle (i.e., charged and discharged once every resonant cycle for the oscillator 116). More specifically, during part of a given oscillation cycle, switching logic 320 of the oscillator core 115 opens a switch 314, and after small underlap time in which both the switch 314 and a switch 318 are open, the switching logic 320 closes the switch 318 to couple the capacitor 308 to ground to discharge the capacitor 308. During another part of the given oscillation cycle, the switching logic 320 opens the switch 318, and after an underlap time in which both switches 314 and 318 are open, the switching logic 320 closes the switch 314 to couple the capacitor 308 to a supply voltage to charge the capacitor 308.

A comparator 310 of the oscillator core 115 includes an input terminal 313 that is coupled to a node 306 of the capacitor 308 to sense the capacitor's voltage (called the "$V_S$ voltage" herein) and an input terminal 311 that senses a variable switching threshold voltage (called the "$V_T$ voltage" herein). The comparator 310 responds to the voltages that are received at the input terminals 311 and 313 to provide an output voltage (called the "$V_C$ voltage" herein), which is the output voltage for the oscillator core 115 and controls operation of the switching logic 320.

Figure 4:
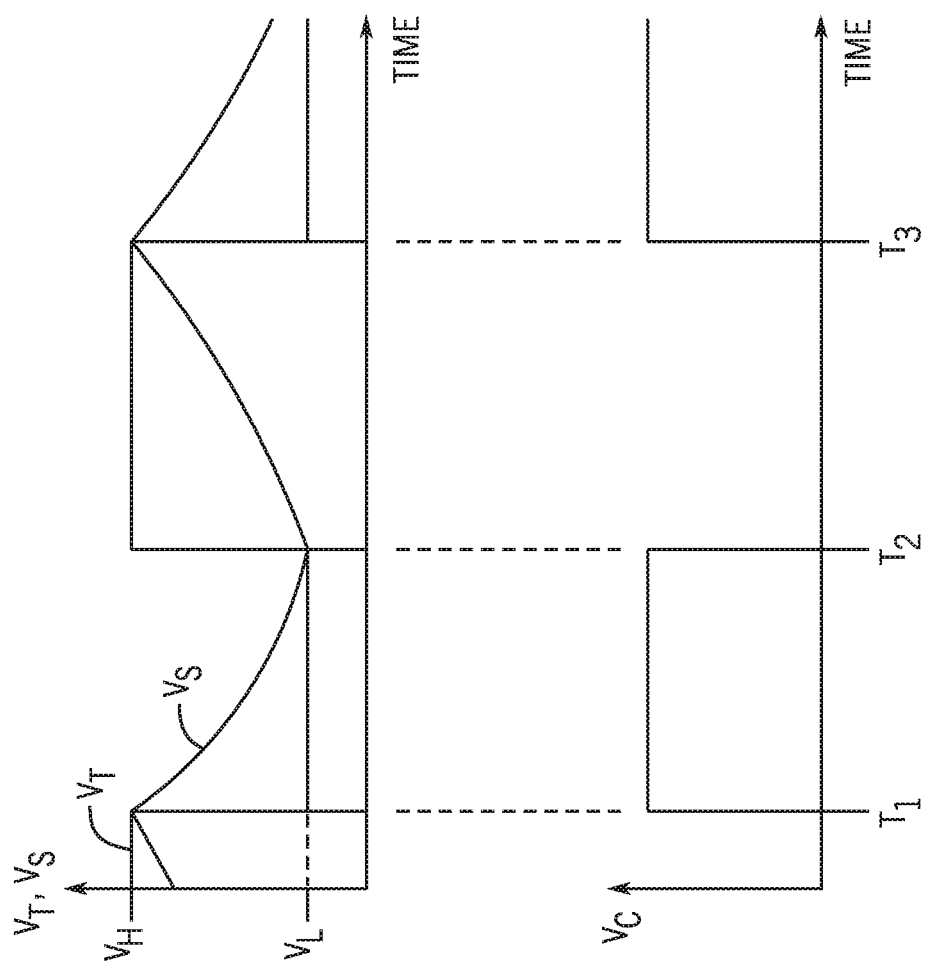
FIGS. 4A and 4B are waveforms of an oscillator core of FIG. 3 according to an example embodiment.

More specifically, referring to FIGS. 4A and 4B in conjunction with FIG. 3, as illustrated from time $T_1$ to time $T_2$ (in an example time segment of an example oscillation cycle), when the capacitor 308 is discharging, the $V_s$ voltage of the capacitor 308 decreases until the $V_s$ voltage reaches a lower threshold (called the "$V_L$ voltage" or "$V_L$ threshold voltage" herein). In response to the $V_S$ voltage reaching the $V_L$ threshold voltage at time $T_2$, the comparator 310 deasserts (drives low, for example) the $V_C$ voltage, as depicted in FIG. 4B. In response to the deassertion of the $V_C$ voltage, the switching logic 320 opens the switch 318, and after an underlap time in which both switches 314 and 318 are open, the switching logic 320 closes the switch 314 to couple the capacitor 308 to a supply voltage to charge the capacitor 308 during times $T_2$ to $T_3$. This charging, in turn, occurs until the $V_S$ voltage reaches an upper threshold voltage (called the "$V_H$ voltage" or "$V_H$ threshold voltage" herein) at time $T_3$; and when this occurs, the comparator 310 asserts (drives high, for example) the $V_C$ voltage. The asserted $V_C$ voltage, in turn, causes the switching logic 320 to open the switch 314 and after an underlap time in which both switches 314 and 318 are open, the switching logic 320 closes the switch 318 to begin another oscillation cycle.

In addition to controlling the switches 314 and 318 to regulate when the capacitor 308 is charging or discharging, the switching logic 320 also controls switches 324 and 328, which control the thresholds against which the comparator 310 compares the $V_S$ voltage of the capacitor 308 (i.e., operating of the switches 324 and 328 controls the $V_T$ Voltage). In this manner, as depicted in FIG. 3, in accordance with example embodiments, the $V_L$ and $V_H$ threshold voltages are provided by nodes 331 and 329, respectively, of a resistor ladder, or network 321. In accordance with example embodiments, when the capacitor 308 begins charging, the switching logic 320 opens the switch 328 and after an underlap time in which the switches 324 and 328 are both open, the switching logic 320 closes the switch 324 to couple the $V_H$ threshold voltage to the input terminal 311 of the comparator 310 (to form the $V_T$ voltage while the capacitor 308 is charging, as depicted in FIG. 4A). When the capacitor 308 begins discharging, the switching logic 320 opens the switch 324, and after an underlap time in which the switches 324 and 328 are both open, the switching logic 320 closes the switch 328 so that the $V_L$ threshold voltage is coupled to the input terminal 311 of the comparator 310 (to form the $V_T$ voltage while the capacitor 308 is discharging, as depicted in FIG. 4A).

Among its other features, in accordance with some embodiments, the oscillator core 115 may include a low dropout (LDO) regulator 334 to regulate a higher supply voltage (called "$V_{DD1}$" in FIG. 3) to provide a lower regulated supply voltage (called "$V_{DD2}$" in FIG. 3), which is used to provide a supply voltage for the comparator 310 and the switching logic 320. In accordance with example embodiments, another LDO regulator 336 of the oscillator core 115 may further regulate the $V_{DD2}$ supply voltage to provide a lower supply voltage (called "$V_{DD3}$" in FIG. 3) that is used to charge the capacitor 308. Although the comparator 310 has an associated 1/f noise, by switching thresholds every oscillation cycle, the oscillation frequency is independent of the 1/f noise, for the 1/f noise that is lower in frequency than the oscillation frequency.

Because the $V_H$ and $V_L$ threshold voltages may be fractions of the $V_{DD3}$ supply voltage, this results in relatively strong tracking between the threshold levels and charging levels. This aspect may provide enhanced frequency stability with respect to the DC level of the power supply. In this manner, the feedback via the comparator 310 and the switching logic 320 forces the $V_S$ capacitor voltage to have a signal swing between the $V_L$ and $V_H$ thresholds without ever physically being connected to the corresponding nodes 329 and 331 of the resistor network 321. Supply immunity is created because the $V_L$ and $V_H$ thresholds are proportional to the $V_{DD3}$ supply voltage, and the charging voltage that is applied to the capacitor 308 is also proportional to the $V_{DD3}$ supply voltage. Therefore, for different DC levels in the $V_{DD3}$ supply voltage, there is little or no change in the oscillation frequency.

A factor affecting oscillator stability is temperature. In accordance with example embodiments, the capacitor 308 may be fabricated with inter-digitated metal fingers so that the capacitance of the capacitor 308 is substantially independent of temperature. The temperature stability of the oscillator core 115 is therefore largely a function of the temperature coefficient of the resistor 304. In accordance with example embodiments, the resistor 304 may be constructed from an appropriate weighting of p-type and n-type poly resistors to achieve a relatively low temperature coefficient (a temperature coefficient of ±50 ppm/C.°, for example).

Although the above-described features of the RC oscillator core 115 may impart a relatively low temperature coefficient for the relaxation oscillator 116, the oscillator core 115 may operate over a relatively wide temperature range, such as a temperature range from −40 to +125 C.°, for example. With such a wide operating temperature range, even a relatively small temperature coefficient may cause the frequency of the oscillator core 115 to vary beyond a desired range (vary beyond ±500 ppm, for example). Therefore, systems and techniques are described herein for purposes of intermittently calibrating, or tuning the relaxation oscillator 116 to regulate variations of the oscillator's frequency due to temperature changes.

Figure 5:
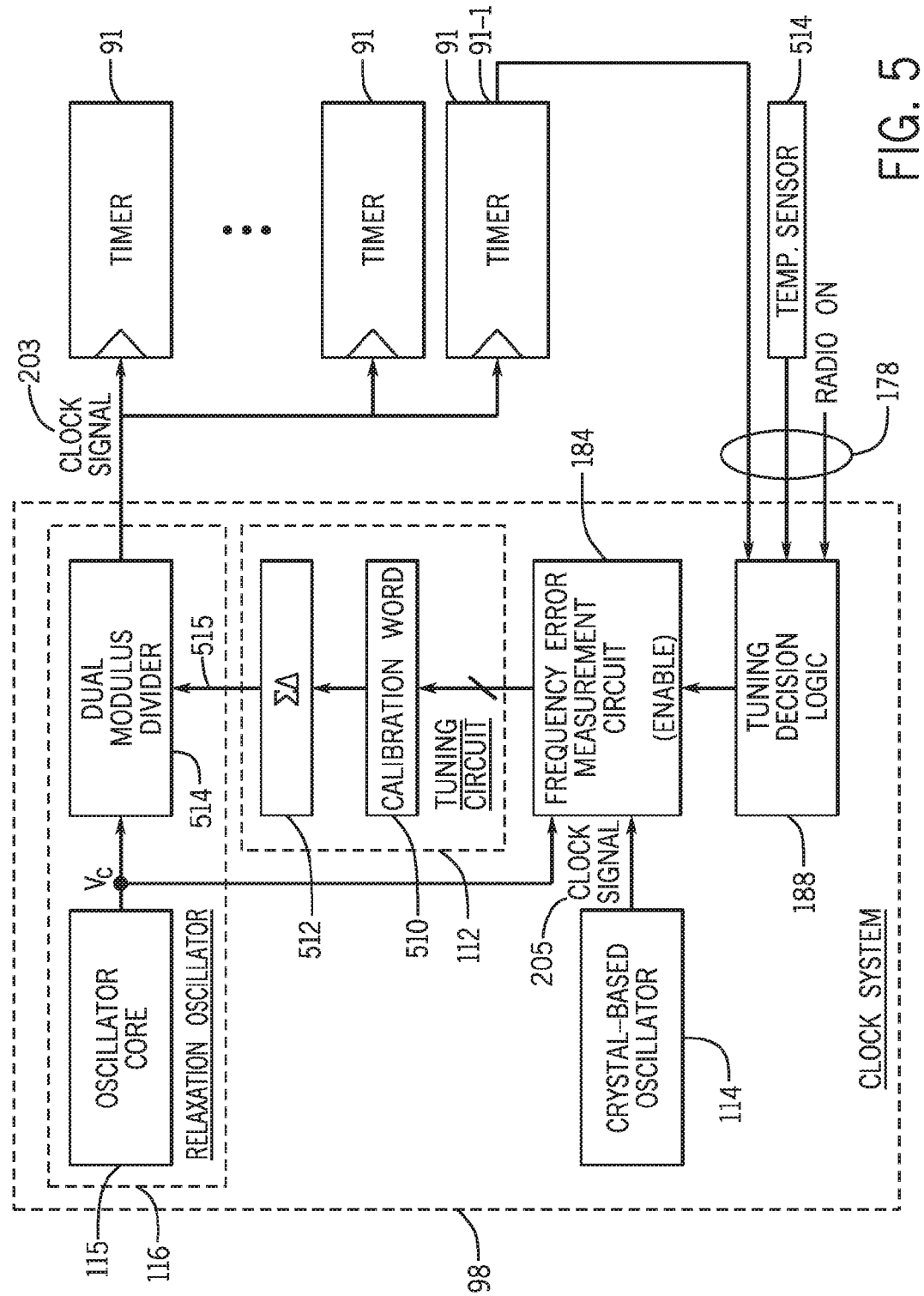
FIG. 5 is a schematic diagram of a clock system of the MCU according to an example embodiment.

Referring to FIG. 5, in accordance with some embodiments, frequency dithering is applied to the $V_C$ clock signal that is provided by the oscillator core 115; and this frequency dithering is regulating for purposes of maintaining a relatively precise clock signal for the relaxation oscillator 116. More specifically, in accordance with example embodiments, the oscillator core 115 may be associated with a nominal frequency that is higher than the target frequency for the relaxation oscillator 116. As a more specific example, for a 32.768 kHz frequency clock signal, the nominal frequency for the oscillator core 115 may be, for example, 40.96 kHz. Moreover, in accordance with some embodiments, both the positive going and negative going edges of the $V_C$ clock signal may be used to clock a dual modulus divider 514.

The dual modulus divider 514 applies frequency dithering to provide the relatively precise clock signal 203 for the oscillator 116. It is assumed for the following examples that the dual modulus divider 514 divides by either two or three. More specifically, in accordance with example embodiments, assuming that the divider 514 operates on both edges of the $V_C$ clock signal provided by the oscillator core 115, the dual modulus divider 514 sometimes divides by two and other times divides by three, to achieve an effective divide ratio of 2.5 for the nominal frequency of the oscillator core 115.

In accordance with example embodiments, whether the dual modulus divider 514 divides by two or three is controlled by a signal that is applied to its control terminal 515. For the example embodiment of FIG. 5, this control signal is provided by the tuning circuit 112 and more particularly, is provided by a sigma-delta modulator 512 of the tuning circuit 112. The sigma-delta modulator 512 produces a control signal that is a function of a calibration word 510 that is received at an input of the sigma-delta modulator 512. The output of the sigma-delta modulator 512 varies, and the time spent by the dual modulus divider 514 dividing by two versus the time spent dividing by three is controlled by the output of the sigma-delta modulator.

Thus, the frequency dithering of the clock signal provided by the oscillator core 115 is controlled by the dithering of the input to the dual modulus divider 514, as controlled by the sigma delta modulator 512.

In accordance with example embodiments, the calibration word 510 is controlled by the frequency error measurement circuit 184. In this manner, the frequency error measurement circuit 184 adjusts the calibration word 510 for purposes of tuning the clock signal 203 to a precise frequency (a frequency of 32.768 kHz, for example). Thus, as depicted in FIG. 5, the relatively precise timers 91 may be clocked by the relaxation oscillator 116.

The tuning decision logic 188 receives signals 178 indicating events that prompt, or trigger, the tuning decision logic 188 to consider whether to enable the frequency error measurement circuit 184 to recalibrate, or retune the relaxation oscillator 116, as described above. In particular, in accordance with some embodiments, one of the signals 178 may indicate when the radio 220 (see FIG. 2, for example) of the MCU 24 is powered up so that the retuning of the relaxation oscillator 116 occurs when the crystal-based oscillator 114 is available. As further described herein, another signal 178 may be a signal that is provided by a temperature sensor 514, which the tuning decision logic 188 uses to determine whether the temperature has significantly changed from the last time the relaxation oscillator 116 was tuned, thereby prompting retuning of the oscillator 116.

As a more specific example, in accordance with some embodiments, the tuning decision logic 188 may determine to retune or recalibrate the relaxation oscillator 116 when the temperature change exceeds 4 C.° since the last time the oscillator 116 was tuned. As also depicted in FIG. 5, in accordance with some embodiments, one of the signals 178 may be a signal from one of the timers 91 (timer 91-1, for example). In this regard, the timer 91-1 may be a watchdog timer, which periodically asserts the signal 178 to cause the tuning decision logic 188 to periodically retune the relaxation oscillator 116. Other signals, 178 may be used to trigger the tuning of the relaxation oscillator 116, in accordance with further embodiments.

In accordance with example embodiments, the frequency error measurement circuit 184 may be a digital counter, which counts the number of cycles of the higher frequency clock signal 205 provided by the crystal-based oscillator 114 to the number of cycles of the clock 203 signal provided by the relaxation oscillator 116 for purposes of determining a frequency error. The signal provided by the frequency error measurement circuit 184 to set the calibration word 510, in turn, may therefore be a function of the frequency error. As a more specific example of the control by the sigma-delta modulator 512, the sigma-delta modulator 512 may update the effective divide ratio of the dual modulus divider 514 from 2.60 to 2.61, if the relaxation oscillator 116, for example, is running too fast.

Figure 6:
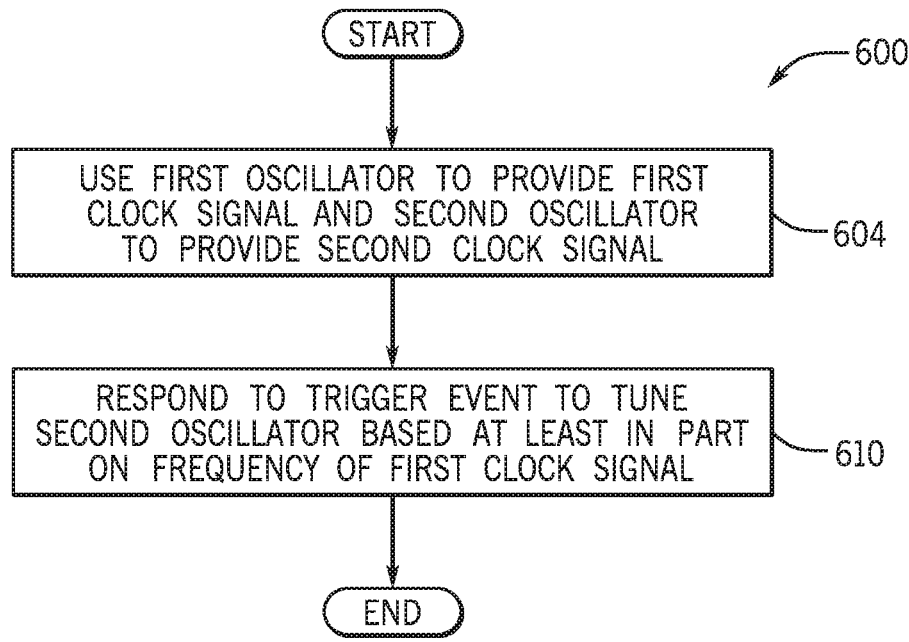
FIGS. 6A and 6B are flow diagrams depicting techniques to provide a low frequency precision oscillator according to example embodiments.

Thus, referring to FIG. 6A, in accordance with example embodiments, a technique 600 includes using (block 604) a first oscillator to provide a first clock signal and a second oscillator to provide a second clock signal. Pursuant to the technique 600, in response to a trigger event, the second oscillator is tuned (block 610) based at least in part on a frequency of the first clock signal.

More specifically, referring to FIG. 6B, in accordance with example embodiments, a technique 620 includes using (block 624) a crystal-based oscillator to provide a clock signal for a radio of an integrated circuit. The technique 620 includes responding to trigger events to intermittently tune a relaxation oscillator based at least in part on a clock signal that is provided by the crystal-based oscillator, pursuant to block 628.

Thus, the frequency adjustment approach of FIG. 5 places a dual-modulus divider after the oscillator core 115. This approach, over the long term, achieves the correct average frequency. However, the approach deletes entire half cycles. This may give rise to two issues: 1. the output clock signal may have a large edge-to-edge timing jitter; and 2. a minimum number of cycles may be needed to be observed to obtain the correct average frequency.

Figure 7:
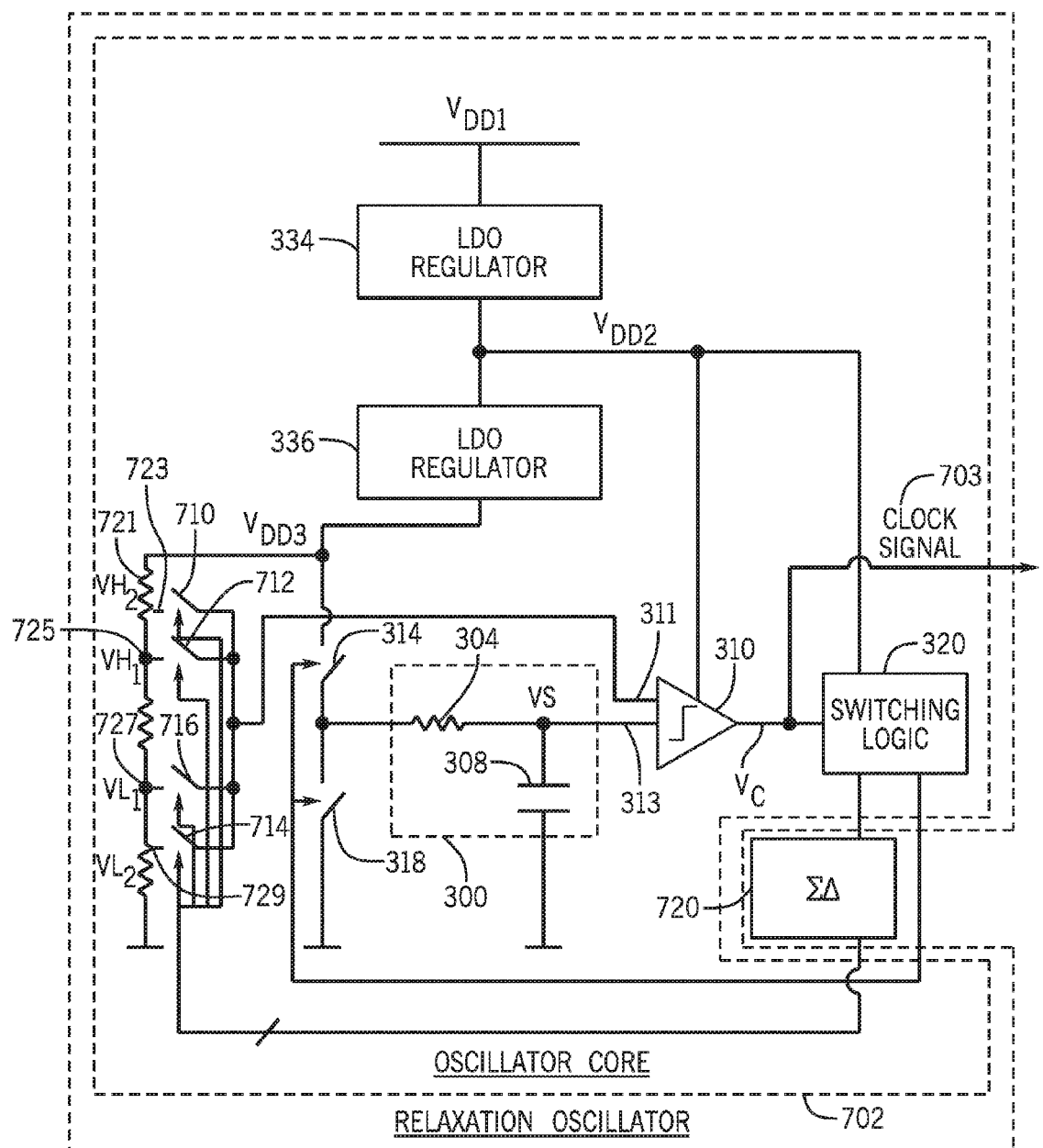
FIG. 7 is a schematic diagram of a relaxation oscillator according to an example embodiment.

In accordance with further embodiments, a relaxation oscillator 700 that is depicted in FIG. 7 may be used in place of relaxation oscillator 116. As shown, the relaxation oscillator 700 provides a clock signal 703. Unlike the relaxation oscillator 116, the relaxation oscillator 700 directly adjusts the oscillation frequency of an oscillator core 702 of the oscillator 700. This results in relatively fine frequency adjustments, thereby resulting in relatively higher accuracy average frequency for relatively short interval measurements. A particular advantage of the relaxation oscillator 700 is that the output of the oscillator 700 may be relatively precise, even for relatively short interval measurements.

More specifically, in accordance with example embodiments, the oscillator core 702 is an RC-based core, which has a similar design to the oscillator core 115 of FIG. 3, with similar reference numerals being used to denote similar elements. However, unlike the oscillator core 115, the oscillator core 702 has dithered $V_H$ and $V_L$ threshold voltages. In this regard, the switches 324 and 328 are replaced by switches 710, 712, 714, and 716 for the oscillator core 702.

The switches 710, 712, 714 and 716, are used to selectively couple the input terminal 311 of the comparator 310 to nodes 723, 725, 727 and 729, respectively of a resistor divider 721 (replacing the resister divider 321 of the oscillator core 115). The nodes 723, 725, 727 and 729 are associated with threshold voltages called $V_{H2}$, $V_{H1}$, $V_{L1}$, and $V_{L2}$, respectively. More specifically, the switches 710 and 712 control the upper threshold that is applied to the input terminal 311 of the comparator 310 during capacitor charging; and the switches 714 and 716 control the lower threshold that is applied to the input terminal 311 of the comparator 310 during capacitor discharging. In accordance with example embodiments, a sigma-delta modulator 720 selects one of the two upper $V_{H1}$ and $V_{H2}$ threshold voltages (via the closing of the appropriate switch 710 and 712 and the opening of the other switch 710 and 712) during the charging of the capacitor 308 and dithers selection of the lower threshold voltages $V_{L1}$ and $V_{L2}$ levels through the use of the switches 714 and 716 when the capacitor 308 discharges. The voltage threshold dithering, in turn, allows relatively fine frequency adjustments to the oscillation frequency.

Figure 8:
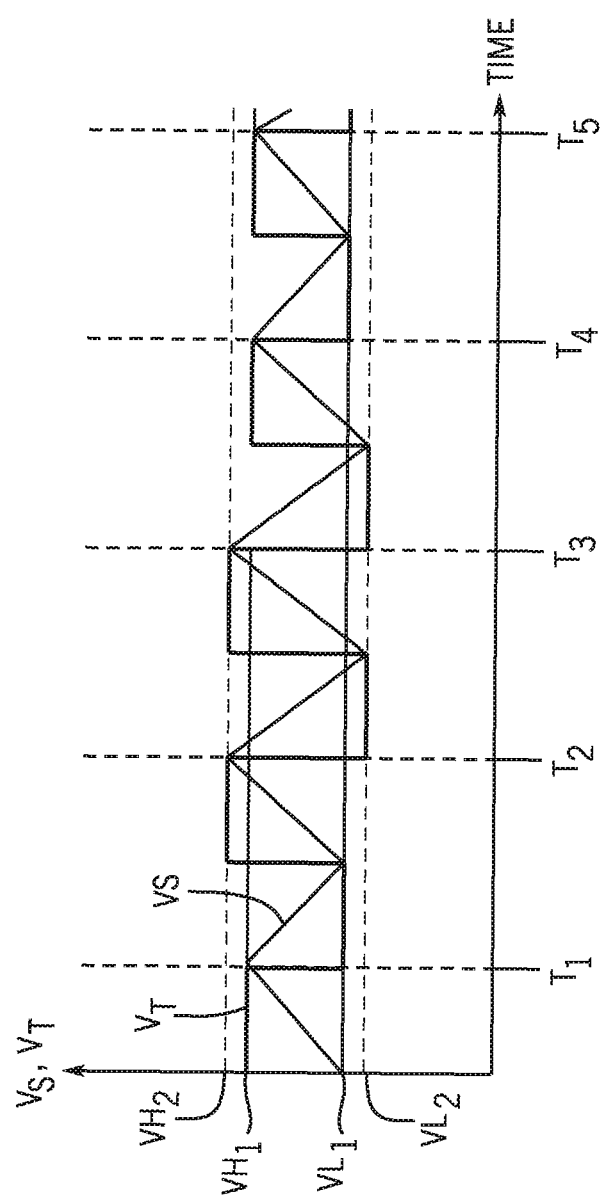
FIG. 8 illustrates waveforms of an oscillator core of the relaxation oscillator of FIG. 7 according to an example embodiment.

More specifically, referring to FIG. 8, in conjunction with FIG. 7, in accordance with example embodiments, the sigma-delta modulator 720 may apply the threshold dithering to cause the capacitor 308 to charge and discharge between the $V_{H1}$ lower, upper threshold voltage and the $V_{L2}$ upper, lower threshold voltage during a given oscillation cycle and subsequently vary between the $V_{H2}$ upper, upper threshold voltage and the $V_{L1}$ lower, lower threshold voltage during another oscillation cycle. In accordance with example embodiments, this voltage threshold dithering may allow the oscillation frequency to be adjusted in fine steps, such as ±3% of the oscillation frequency. Thus, the timing jitter of the clock signal clock signal 703 provided by the RC oscillator 700 may be relatively small and hence, much less averaging time may be used to obtain the desired interval accuracy.

Figure 9:
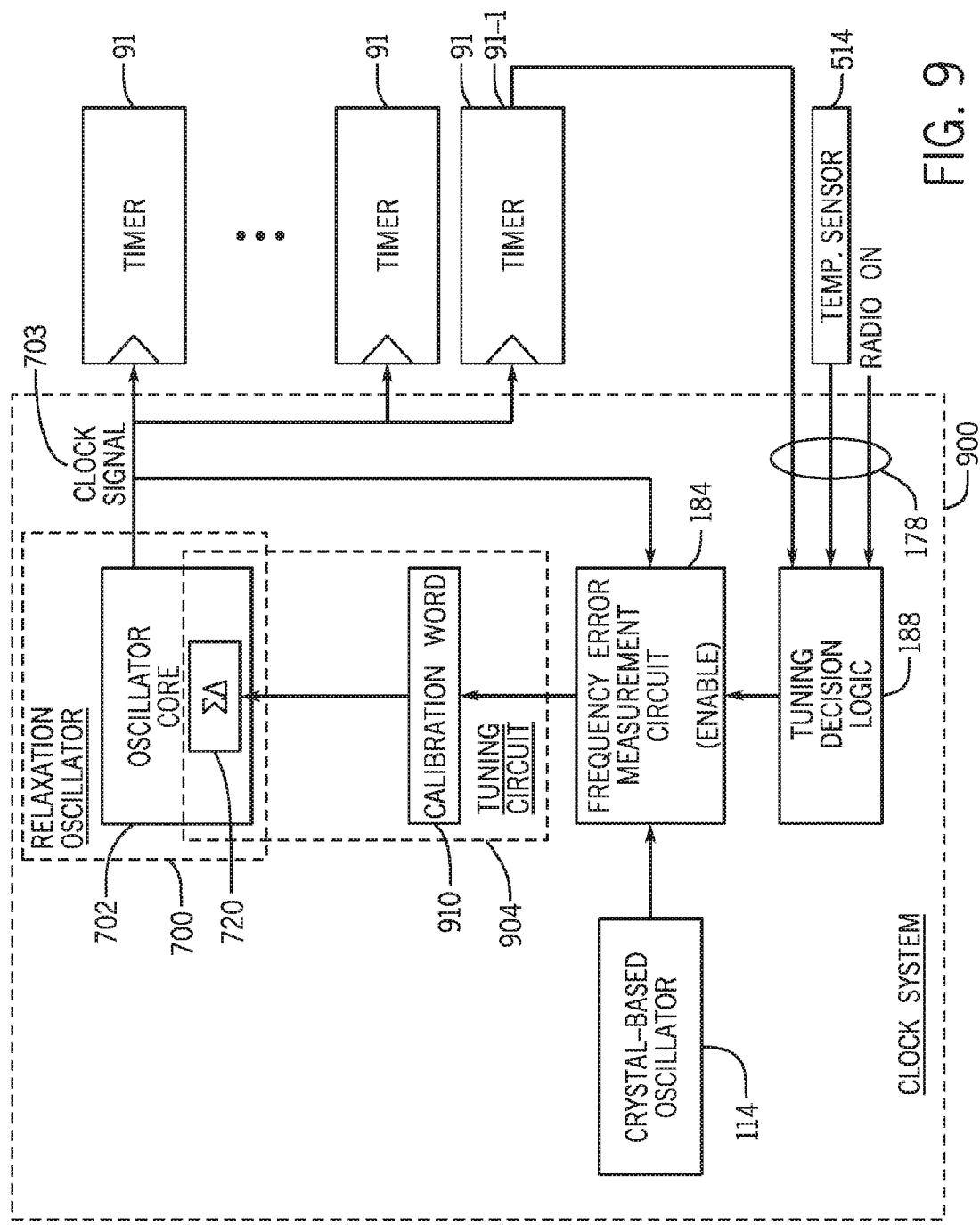
FIG. 9 is a schematic diagram of a clock system of the MCU according to a further example embodiment.

Referring to FIG. 9, a clock system 900 (replacing the clock system 98) that uses the above-described threshold level dithering includes the RC-oscillator 700; a tuning circuit 904 (replacing the tuning circuit 112), which includes the sigma delta modulator 720 that responds to a calibration word 910; the frequency error measurement circuit 184; and the tuning decision logic 188.

Dithering may be used inside the core of the relaxation oscillator to adjust parameters other than the threshold levels, in accordance with further example embodiments. For example, the oscillation frequency may be tuned by using a sigma-delta modulator to dither the capacitance of the capacitor 308. In this manner, in accordance with some embodiments, the capacitor 308 may be formed from a bank of capacitors having switches that may be selectively opened and closed for purposes of selecting the capacitance 308; and this selection, may be controlled by a dithering provided by a sigma-delta modulator. As another example, in accordance with further example embodiments, the resistor 304 may be provided by a group of resistors that are selectively coupled and decoupled from the composite resistance by associated switches. This coupling and decoupling may be controlled by a sigma-delta modulator.

A particular advantage of dithering the threshold levels is that three different adjustments may be kept completely separate: 1. the capacitance of the capacitor 308 may be adjusted at the time of manufacture to coarsely trim the oscillation frequency of the relaxation oscillator 700 two within a small percentage of the desired frequency; 2. the threshold levels may be dynamically dithered during normal operation to fine-tune the relaxation oscillator 700; and 3. the resistance of the resistor 304 may be programmed based on laboratory measurements to select the relative percentage of p-poly and n-poly resistors for purposes of maximizing the temperature stability of the oscillator core.

Figure 10:
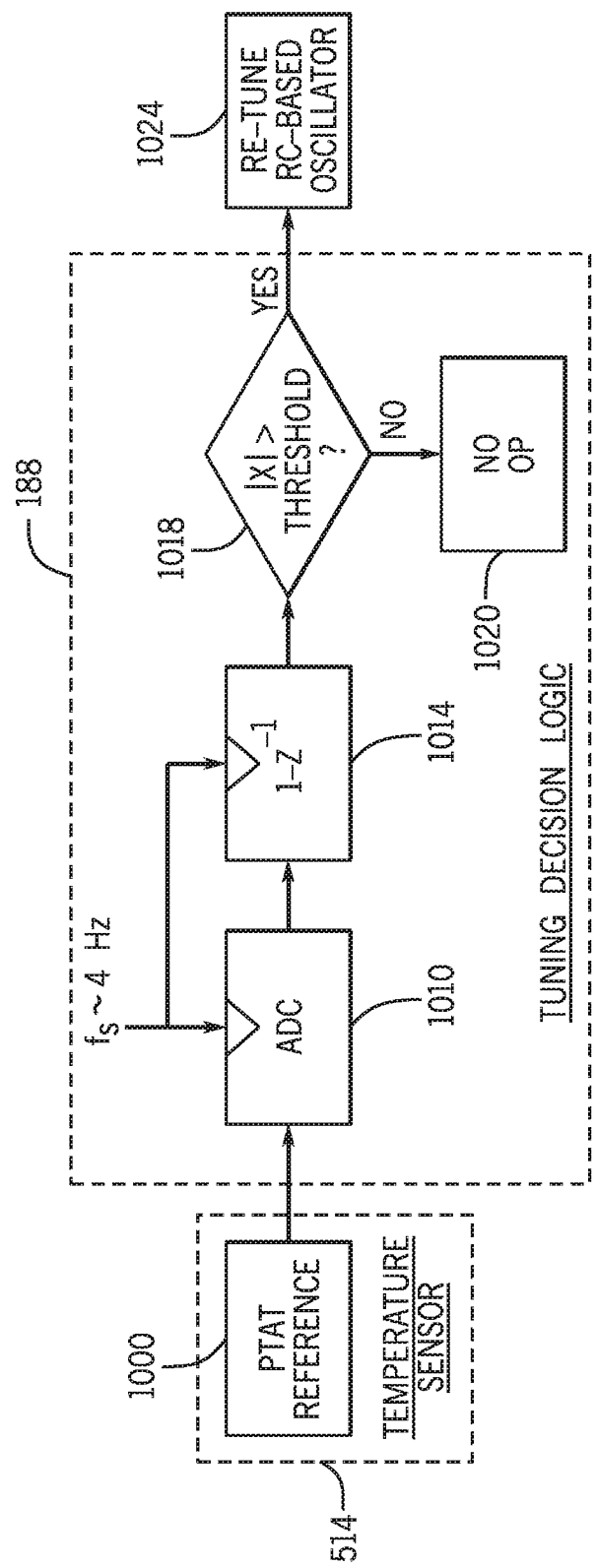
FIGS. 10 and 11 are schematic diagrams of tuning decision logic circuits according to example embodiments.

Referring to FIG. 10, in accordance with example embodiments, the temperature sensor 514 may be formed by a proportional to absolute temperature (PTAT) reference 1000, such as a PTAT current source. The PTAT reference 1000 provides a signal that proportionally indicates a given temperature change. The tuning decision logic 188 may include an analog-to-digital converter (ADC) 1010, which is sampled at a relatively low sampling frequency (a sampling frequency of 4 Hz, for example). The tuning decision logic 188 may further include logic 1014 to compare successive samples (as indicated by the ADC output) for purposes of determining (decision logic 1018) whether the temperature has changed by a predetermined threshold between time successive samples. For example, in accordance with some embodiments, this threshold may be 4 C.°. In this regard, if the threshold has been met, in accordance with some embodiments, the tuning decision logic 188 generates a signal 1024 to enable the frequency error measurement circuit 184 to cause re-tuning of the relaxation oscillator. Otherwise, a no operation signal 1020 may be generated.

Figure 11:
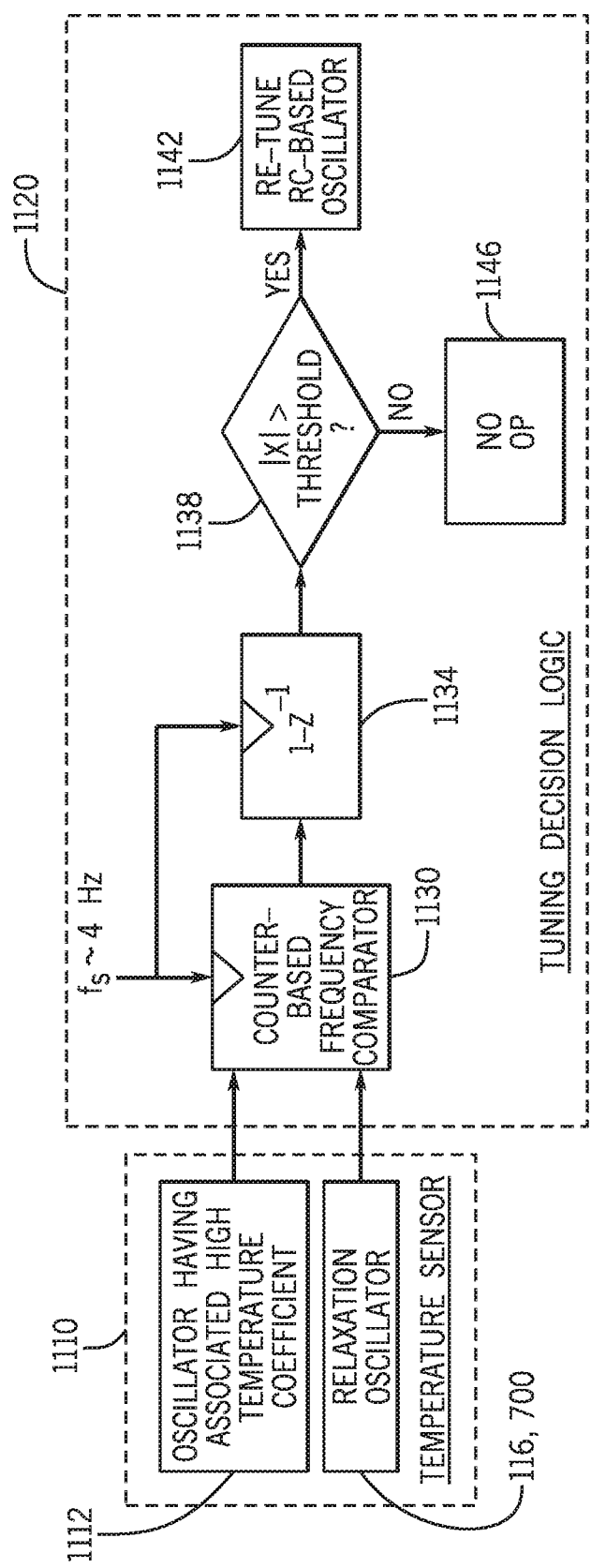

As another variation, in accordance with better example embodiments, tuning decision logic 1120, as shown in FIG. 11, may be used. For this embodiment, the tuning decision logic 1120 uses a temperature signal that is provided by the frequency difference of two clock signals that are generated by two oscillators. More specifically, for the embodiment of FIG. 11, a temperature sensor 1110 includes the relaxation oscillator 116, 700, which has a relatively low associated temperature coefficient and an oscillator 1112 that has a relatively high associated temperature coefficient. In other words, the clock signal provided by the relaxation oscillator 116, 700 varies little with respect to temperature, as compared to the clock signal that is provided by the oscillator 1112.

For this embodiment, the tuning decision logic 1120 includes a counter-based frequency comparator 1130 that provides a signal that represents the frequency difference. In this manner, the frequency comparator 1130 compares the clock signals that are generated by the oscillators of the temperature sensor 1110. The comparator 1130 counts the number of cycles of one of the clock signals in a given period versus the number of cycles of the other clock signal during the same period, and the comparator 1130 generates a signal representing the error (i.e., representing a temperature measurement). Logic 1134 of the tuning decision logic 1120 indicates a change between successive samples. If logic 1138 of the tuning decision logic 1120 indicates that the frequency change exceeds a threshold, then the logic 1138 asserts a signal 1142 to cause retuning of the relaxation oscillator. Otherwise, a no operation signal 1146 is generated (i.e., retuning is not initiated).

Figure 12A:
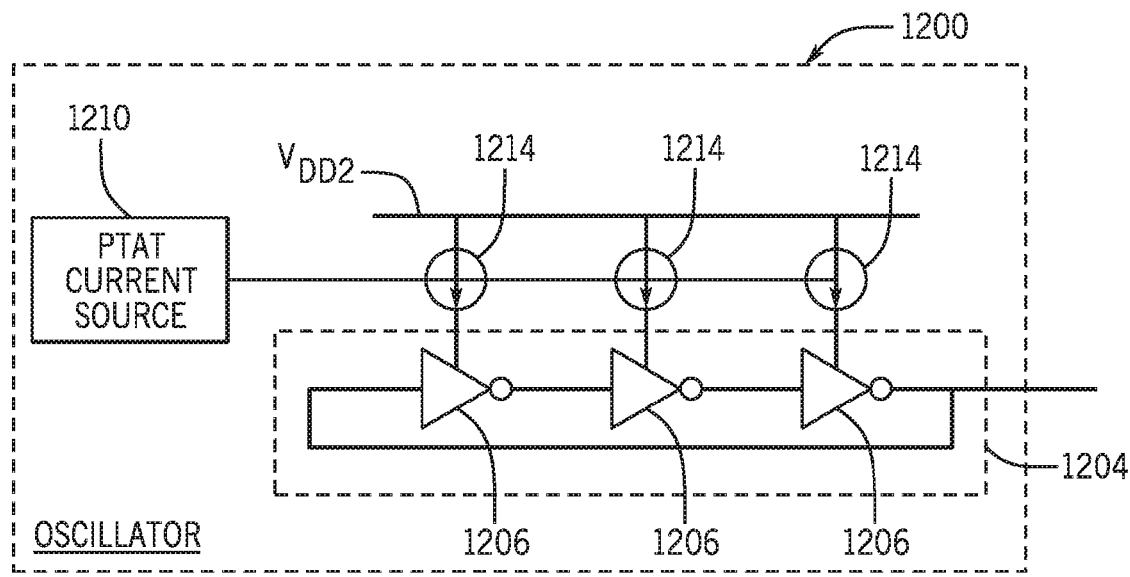
FIGS. 12A and 12B are schematic diagrams of oscillators having relatively large temperature coefficients according to example embodiments.

In accordance with some embodiments, the oscillator 1112 having a relatively high associated temperature coefficient may include a PTAT source, such as an oscillator 1200 of FIG. 12A. The oscillator 1200 includes a ring 1204 of an odd number of inverters 1206. Any odd number of inverters 1206 may be implemented, depending on the particular embodiment. To impart the temperature instability, at least one of the inverters 1206 receives its supply current from a current source 1214 that is controlled by a PTAT current source 1210. For example, in accordance with some embodiments, current sources 1214 may supply currents to the inverters 1206; and the current sources 1214 may mirror the current provided by the PTAT current source 1210.

Figure 12B:
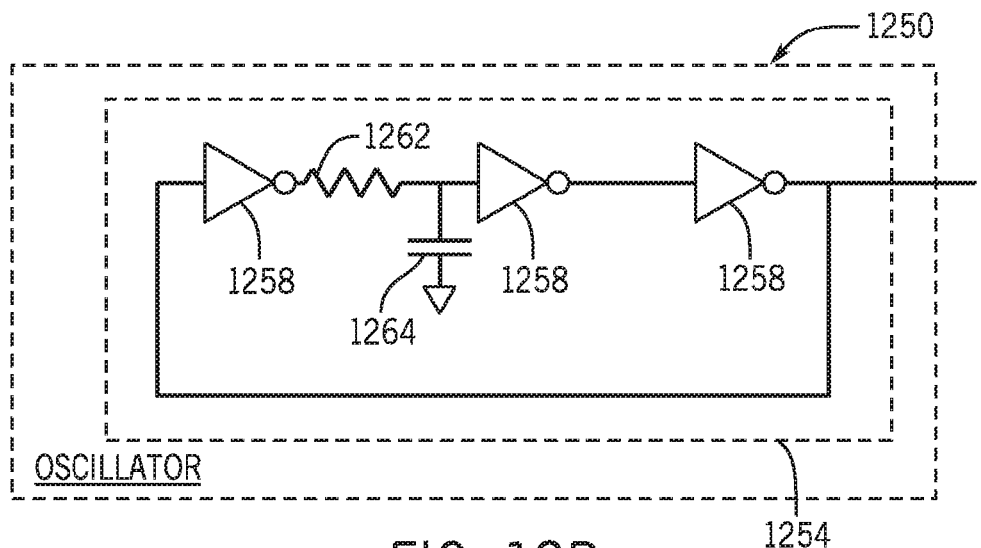

Referring to FIG. 12B, in accordance with further example embodiments, an oscillator 1250 having a high associated temperature coefficient may include a ring 1254 of an odd number of inverters 1258. Any odd number of inverters 1258 may be implemented, depending on the particular embodiment. For the oscillator 1250, temperature instability is introduced by a resistor 1262 that is coupled between the input terminal of one of the inverters 1258 and the output terminal of another inverter 1258. Moreover, as shown, a capacitor 1264 is coupled between the input terminals of the inverter 1258 and ground.

Other high temperature coefficients, temperature sensors and other oscillators may be used, in accordance with further embodiments.

While the present techniques have been described with respect to a number of embodiments, it will be appreciated that numerous modifications and variations may be applicable therefrom. It is intended that the appended claims cover all such modifications and variations as fall within the scope of the present techniques.

What is claimed is:

1. A method comprising:
using a first oscillator to clock operations of a radio of an integrated circuit (IC);
intermittently using the first oscillator to frequency tune a second oscillator of the IC, wherein intermittently using the first oscillator to frequency tune the second oscillator comprises intermittently changing a dithering applied to an oscillation frequency of an oscillator core of the second oscillator;
using the oscillator core to provide a signal cycling between an upper threshold and a lower threshold at the oscillation frequency of the oscillator core; and
dithering the upper and lower thresholds,
wherein intermittently changing the dithering applied to the oscillation frequency comprises intermittently adjusting the dithering of the upper and lower thresholds.

2. The method of claim 1, wherein intermittently using the first oscillator to frequency tune the second oscillator comprises:
triggering tuning of a clock signal provided by the second oscillator in response to a timer event, powering up of the radio or a detected temperature change.

3. An apparatus comprising:
a first oscillator to provide a first clock signal;
a second oscillator to provide a second clock signal, wherein the second oscillator comprises an oscillator core; and
a tuning circuit to respond to a trigger event to tune the second oscillator based at least in part on a frequency of the first clock signal, wherein the tuning circuit comprises:
a frequency measurement circuit to provide a signal representing a difference between the frequency of the first clock signal and a frequency of the second clock signal; and
a sigma delta modulator to respond to the signal provided by the frequency measurement circuit to control an oscillator frequency of the oscillator core.

4. The apparatus of claim 3, wherein:
the second oscillator core comprises:
a resistor-capacitor (RC) relaxation circuit to provide a signal;
a first switch to charge the RC relaxation circuit;
a second switch to discharge the RC relaxation circuit;
a comparator to provide the second clock signal, the comparator to compare the signal provided by the RC relaxation circuit to upper and lower thresholds and modify the frequency of the second clock signal in response to a result of the comparison; and
a third switch to regulate the upper and lower thresholds; and the tuning circuit comprises:
a frequency measurement circuit to provide a signal representing a difference between the frequency of the first clock signal and a frequency of the second clock signal; and
a sigma delta modulator to respond to the signal provided by the frequency measurement circuit to control operation of the third switches to control the upper and lower thresholds.

5. An apparatus comprising:
an integrated circuit (IC) comprising a radio, a crystal-based oscillator to provide a clock signal for the radio, a resistor-capacitor (RC)-based oscillator, a temperature change detection circuit and a tuning circuit,
wherein:
the tuning circuit responds to trigger events to intermittently tune the RC-based oscillator based at least in part on a frequency of the clock signal provided by the crystal-based oscillator;
the temperature change detection circuit to detect a temperature change associated with the RC-based oscillator and selectively assert a signal to initiate a trigger event in response to a result of the detection;
the IC comprises a temperature variable current source; and
the temperature change detection circuit samples a current provided by the temperature variable current source over time, compares samples associated with different times to a change threshold, and selectively asserts the signal to initiate the trigger event based a result of the comparison.

6. The apparatus of claim 5, wherein the trigger events comprise watchdog timer events or power state transitions of the radio.

7. An apparatus comprising:
a first oscillator to provide a first clock signal;

a second oscillator to provide a second clock signal, wherein the second oscillator comprises an oscillator core and a multiple modulus divider to provide the second clock signal, the multiple modulus divider comprising a control terminal to select a modulus from a plurality of moduli; and a tuning circuit to respond to a trigger event to tune the second oscillator based at least in part on a frequency of the first clock signal, wherein the tuning circuit comprises:
- a frequency measurement circuit to provide a signal representing a difference between the frequency of the first clock signal and a frequency of the second clock signal; and
- a sigma delta modulator to respond to the signal provided by the frequency measurement circuit to provide a signal to the control terminal of the multiple modulus divider.

8. An apparatus comprising:

an integrated circuit (IC) comprising a radio, a crystal-based oscillator to provide a clock signal for the radio, a resistor-capacitor (RC)-based oscillator, a temperature change detection circuit, and a tuning circuit, wherein:
the tuning circuit responds to trigger events to intermittently tune the RC-based oscillator based at least in part on a frequency of the clock signal provided by the crystal-based oscillator;

the temper change detection circuit to detect a temperature change associated with the RC-based oscillator and selectively assert a signal to initiate a trigger then in response to a result of the detection;

the IC comprises a third oscillator having an associated temperature coefficient;

the temperature coefficient associate with the third oscillator is greater than a temperature coefficient associated with the RC-based oscillator;

the temperature change detection circuit compares a frequency of the clock signal provided by the RC-based oscillator with a frequency of a clock signal provided by a third oscillator; and the temperature change detection circuit selectively asserts the signal to initiate the trigger event based on the result of the comparison.

9. The apparatus of claim 8, wherein the third oscillator comprises:
a ring-based oscillator comprising a resistor in a signal path of the ring-based oscillator.

10. The apparatus of claim 8, wherein the third oscillator comprises:
a ring-based oscillator comprising inverters; and
a temperature dependent current source to supply current to at least one of the inverters.

* * * * *